United States Patent [19]
Krech, Jr.

[11] Patent Number: 5,822,516
[45] Date of Patent: Oct. 13, 1998

[54] ENHANCED TEST METHOD FOR AN APPLICATION-SPECIFIC MEMORY SCHEME

[75] Inventor: Alan S. Krech, Jr., Fort Collins, Colo.

[73] Assignee: Hewlett-Packard Company, Palo Alto, Calif.

[21] Appl. No.: 784,621

[22] Filed: Jan. 21, 1997

Related U.S. Application Data

[63] Continuation of Ser. No. 441,856, May 16, 1995, Pat. No. 5,657,443.

[51] Int. Cl.⁶ .............................. G06F 11/00; G06F 12/00
[52] U.S. Cl. ............................... 395/183.18; 395/183.16; 711/173; 711/101; 371/21.1
[58] Field of Search ..................... 395/183.18, 183.16, 395/183.05, 182.03, 182.06, 185.07; 711/101, 104, 129, 153, 173, 102, 103, 105; 365/201; 371/21.1, 21.2, 40.14, 10.2

[56] References Cited

U.S. PATENT DOCUMENTS

| | | | |
|---|---|---|---|
| 3,751,649 | 8/1973 | Hart, Jr. | 235/153 |
| 4,604,695 | 8/1986 | Widen et al. | 711/217 |
| 4,663,728 | 5/1987 | Weatherford et al. | 711/155 |
| 4,696,005 | 9/1987 | Millham et al. | 371/21.6 |
| 4,751,636 | 6/1988 | Sibley | 364/200 |
| 4,774,687 | 9/1988 | Taniguchi et al. | 711/117 |
| 5,033,048 | 7/1991 | Pierce et al. | 371/21.2 |
| 5,138,619 | 8/1992 | Fasang et al. | 371/21.1 |
| 5,321,701 | 6/1994 | Raymond et al. | 371/25.1 |
| 5,388,104 | 2/1995 | Shirotori et al. | 371/21.1 |
| 5,479,413 | 12/1995 | Sicola et al. | 371/21.1 |
| 5,524,263 | 6/1996 | Griffth et al. | 395/800 |

*Primary Examiner*—Dieu-Minh Le
*Attorney, Agent, or Firm*—Kevin M. Hart

[57] ABSTRACT

An enhanced test system in a processor having a memory supporting multiple memory schemes. The memory is partitioned into memory blocks and memory sub-blocks. A plurality of uniform data units each comprising a plurality of data fields is written to and read from each successive memory block in a FIFO manner so that a data field within each data unit, having a maximum field width, occupies each of the multiple memory locations at least once during testing. The enhanced test system maximizes the number of adjacent full-width data fields to test vertically and horizontally for field overflow within memory by writing and reading seriatim by data unit or partitioned by data field width, in adjacent memory blocks and sub-blocks, or overlapping memory blocks and overlapping sub-blocks.

3 Claims, 11 Drawing Sheets

|     | INPUT FIFO  102 | RAM BUFFER 105 | RAM BUFFER 107 | FIFO / RAM 112 | FIFO / RAM 115 | OUTPUT FIFO 127 |
|-----|-----------------|----------------|----------------|----------------|----------------|-----------------|
| 130 | TRIANGLE 0      | TRIANGLE 0     | —              | —              | —              | —               |
| 135 | TRIANGLE 1      | TRIANGLE 0     | TRIANGLE 1     | TRIANGLE 0     | —              | —               |
| 140 | TRIANGLE 2      | TRIANGLE 2     | TRIANGLE 1     | TRIANGLE 0     | TRIANGLE 1     | TRIANGLE 0      |
| 145 | PT 0            | TRIANGLE 2     | —              | TRIANGLE 2     | PT 0           | TRIANGLE 1      |
| 150 | PT 1            | TRIANGLE 2     | —              | TRIANGLE 2     | PT 1           | TRIANGLE 2      |
| 155 | PT 2            | TRIANGLE 2     | TRIANGLE 3     | TRIANGLE 2     | PT 2           | PT 0            |
| 160 | TRIANGLE 3      | TRIANGLE 4     | TRIANGLE 3     | TRIANGLE 3     | —              | PT 1            |
| 165 | TRIANGLE 4      | TRIANGLE 4     | TRIANGLE 3     | TRIANGLE 3     | —              | PT 2            |
| 170 | —               | TRIANGLE 4     | —              | TRIANGLE 3     | TRIANGLE 4     | TRIANGLE 3      |

*FIG. 2*

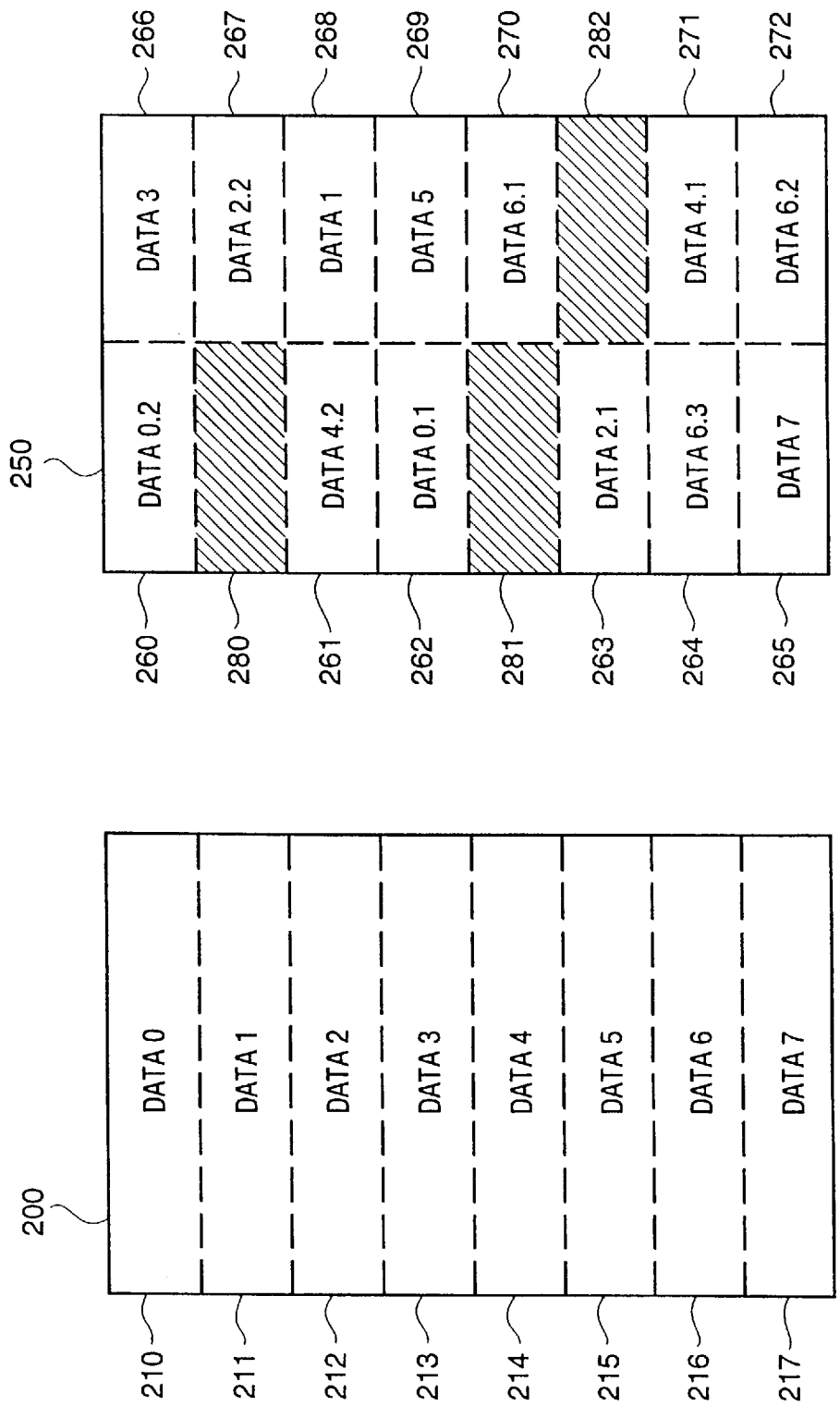

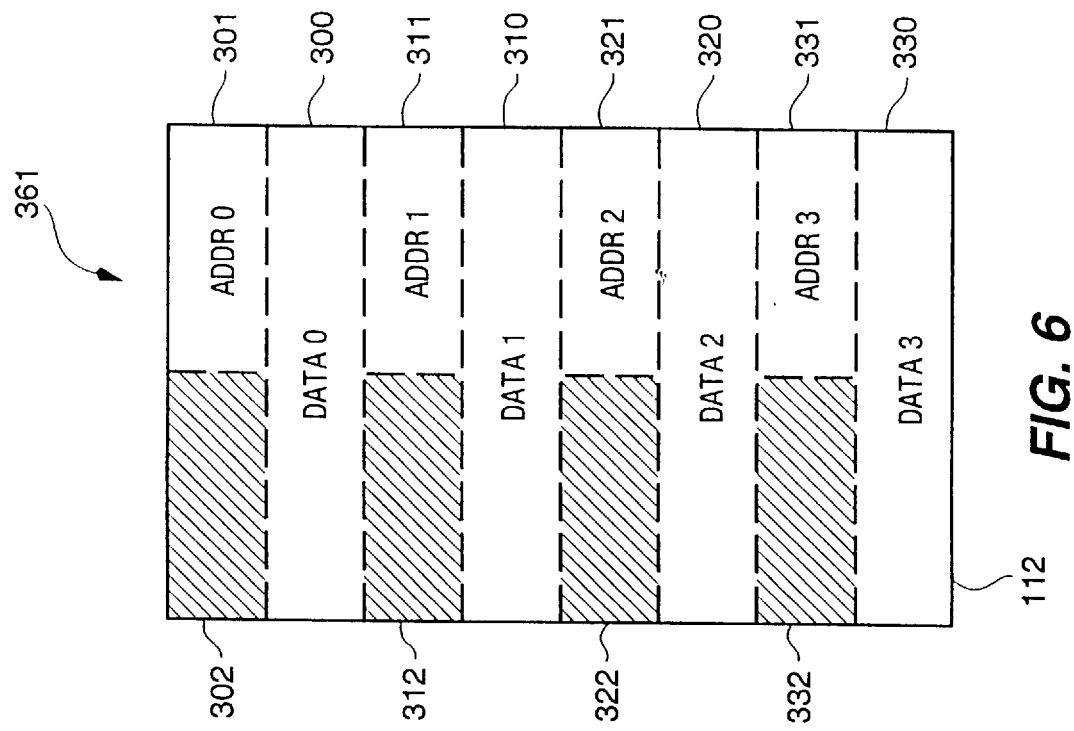
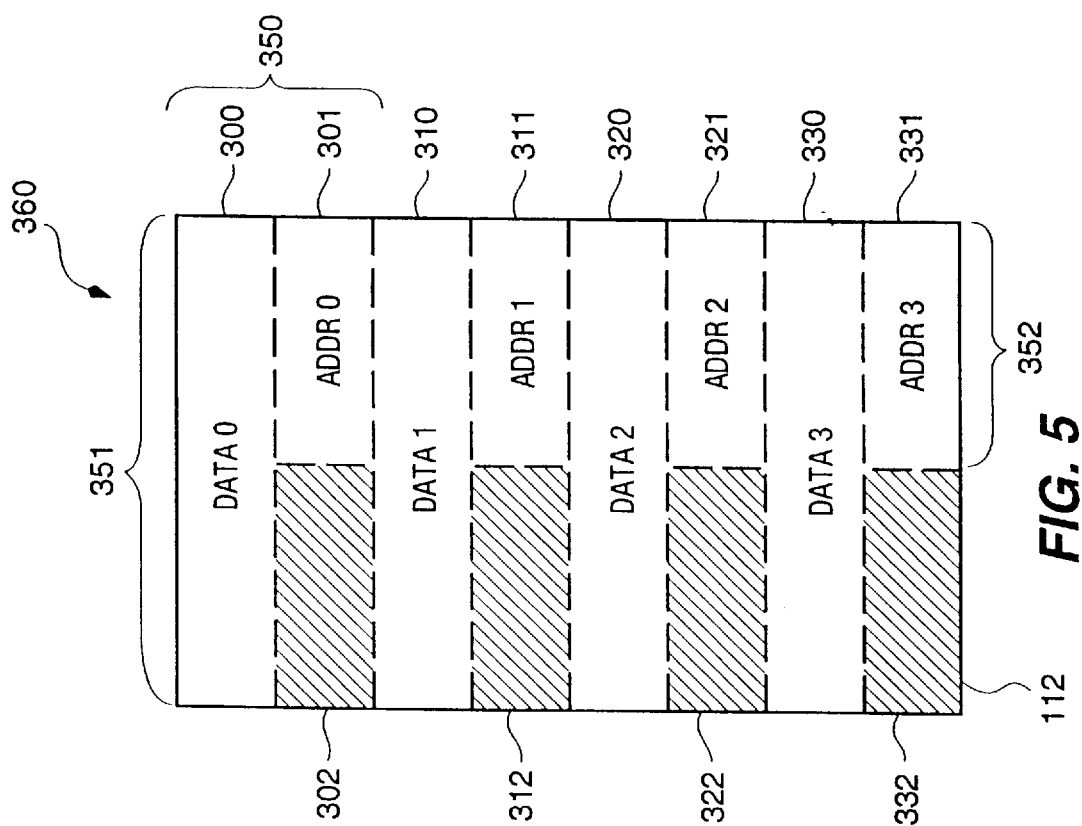

ENHANCED TEST METHOD FOR AN APPLICATION-SPECIFIC MEMORY SCHEME

CROSS REFERENCE TO RELATED APPLICATION

This is a continuation of application Ser. No. 08/441,856 filed on May 16, 1995 and now U.S. Pat. No. 5,657,443 issued on Aug. 12, 1997.

BACKGROUND OF THE INVENTION

1. Field of the Invention

This invention relates to testing memory components, and in particular, to testing a memory scheme and the memory itself in a dual purpose FIFO/RAM implementation.

2. Description of the Related Art

It is a problem in the field of high-performance, low-cost graphics accelerator circuits used in three-dimensional imaging devices, to verify the circuit's reliability by thoroughly testing memory used in the circuit. Key to testing memory includes, but is not limited to, manipulating the memory in a manner consistent with the implemented memory scheme while testing for anomalies caused by the memory itself. The purpose of testing memory is to verify that the memory scheme and the memory itself operate within acceptable fault parameters.

Testing the memory itself involves testing the ability to store data without the data being lost or corrupted due to a flaw in the electronics or the materials upon which the memory is based. More specifically, due to increasingly complex and miniaturized memory being integrated into electronic circuits, testing horizontally and vertically adjacent memory locations for field overflow is paramount. Field overflow occurs where adjacent bits in a dielectric influence each other due to inadequate insulating properties in the dielectric for the spacing provided between bits. Field overflow results in an unstable memory that corrupts data thereby rendering the memory unreliable.

Testing a memory scheme in a manner consistent with its implementation is a routine process where an ordinary memory scheme is involved. However, in architectures subject to severe circuit space constraints, it is increasingly desirable to implement a hybrid memory scheme to maximize memory use. For example, if a single memory could be used either as a First In First Out (FIFO) memory or as a Random Access Memory (RAM) scheme as needed, a significant circuit space savings could be realized. Unfortunately, such a hybrid memory scheme presents unique problems if circuit design space constraints allow for only minimal test circuitry. Additional problems are created if the FIFO scheme used in the hybrid memory scheme writes successive data units that include data fields each having different field widths.

For example, in the graphics accelerator in which the present invention was developed, a FIFO scheme writes a data unit comprising a partial field width hardware address and a full field width data field in two adjacent memory locations that are each a full field width wide. This makes testing for field overflow difficult if the FIFO scheme is tested in a manner consistent with the implementation. Complicating the testing is the fact that the memory is used as a hybrid FIFO/RAM that uses all available memory locations when functioning as a RAM and only a subset of the available memory locations when functioning as a FIFO.

To fully test a traditional RAM scheme requires a complex test design that writes and reads specific memory test patterns. Further, because testing memory involves field overflow testing, specific patterns must be written to specific memory locations in the RAM.

Testing a traditional FIFO scheme is typically accomplished by writing successive data fields having a common field width into adjacent memory locations, and then reading the data fields in the order written. Identifying a memory location to write to and read from is accomplished by an incremented write/read address pointer. However, if the FIFO scheme writes successive data units comprising multiple data fields each having different fixed field widths, testing memory for field overflow is more complicated due to the memory fragmentation from unused memory locations.

Because the RAM scheme utilizes all memory locations and the FIFO scheme requires only a subset of the memory in different fixed field widths, neither of the traditional FIFO or RAM testing designs are well suited for testing a memory that uses a hybrid RAM/FIFO memory scheme. Therefore, traditional test designs fail to test all memory locations in a memory that is based on a hybrid RAM/FIFO memory scheme, and a solution to this problem is desirable. The existing need for a hybrid RAM/FIFO memory scheme test design has heretofore not been satisfied.

SUMMARY OF THE INVENTION

The above-described problems are solved and a technical advance achieved in the field by an enhanced test system for an application-specific memory scheme. In a graphics accelerator using a hybrid RAM/FIFO memory scheme, testing the hybrid memory is better accommodated by using a FIFO approach thereby providing the ability to easily control read and write access to specific memory locations.

Rather than use a strictly traditional FIFO scheme in which write and read pointers point to successive memory locations, the enhanced test system of the present invention uses a modified programmable pointer system that points to a specific memory location for each data field within a data unit so that each data field can be independently manipulated. The read and write pointers are programmably modified by replacing one or more bits in the pointer with bits from a programmable register in the test system circuitry.

Each read/write pointer has a pointer width determined by the number of memory locations that need be addressed to test all available memory locations. However, the pointer width can be minimized by dividing the memory being tested into smaller memory blocks, with each block containing a number of memory locations equal to some multiple of the number of data fields within a data unit. The pointer width can then be limited to only the number of bits required to address each block and the few memory locations therein. Reducing the pointer width and the addressing complexity further reduces the test circuitry that must be implemented to fully test the memory in a circuit design already short on available circuit space.

In one embodiment, the enhanced test system writes and reads data as a data unit in adjacent address field/data field order for a first testing phase. The unused address field width is always located in a known location. The next testing phase writes and reads data as a data unit in reverse data field/ address field order so that the memory locations previously having the unused address field width are now occupied by a full-width data field. The write/read cycles are repeated for each subsequent memory block until all memory locations in the memory are occupied at least once with a full-width data field. This test technique verifies the basic operational status of each memory location and tests for horizontal field overflow within each memory location. Vertical field overflow is not fully tested by this test technique because there is no time where a full-width data field is surrounded by adjacent full-width data fields.

In another embodiment, the enhanced test system writes and reads data in field width segregated order within a sub-block of a memory block such that the data field and address field are not adjacent. Here for example, in a first testing phase the partial width address fields are written in upper memory sub-block locations while the full-width data fields are written in lower memory sub-block locations. In a subsequent testing phase the enhanced test system writes and reads the full-width data fields in upper memory sub-block locations while the partial width address fields are written in lower memory sub-block locations. Subsequent memory blocks are tested in a similar fashion. This test technique results in only one boundary per block where a full-width field is adjacent to a partial width field. All other memory locations are simultaneously surrounded by adjacent full-width data fields at least once during the testing, thereby adequately testing for field overflow conditions.

In another embodiment, the enhanced test system writes and reads data in field width segregated order within memory sub-blocks in a manner similar to the previous embodiment. However, in this embodiment, the sub-block boundaries within each memory block are overlapped so that every memory location is simultaneously surrounded by adjacent full-width data fields at least once during testing. This test technique fully tests for field overflow among horizontally and vertically adjacent bits in adjacent memory locations.

In any of the above embodiments, special bit strings can be written into full-width data fields so that no one bit is horizontally, vertically, or diagonally adjacent to another bit of the same value (0 or 1). Such a bit string provides additional validity to field overflow test results.

BRIEF DESCRIPTION OF THE DRAWINGS

FIG. 2 illustrates primitive throughput for the graphics accelerator;

FIGS. 3 and 4 illustrate block diagrams of traditional FIFO and RAM memory schemes respectively;

FIGS. 5–7 illustrate block diagrams of the enhanced test system;

DESCRIPTION OF THE PREFERRED EMBODIMENT

Figure 1:
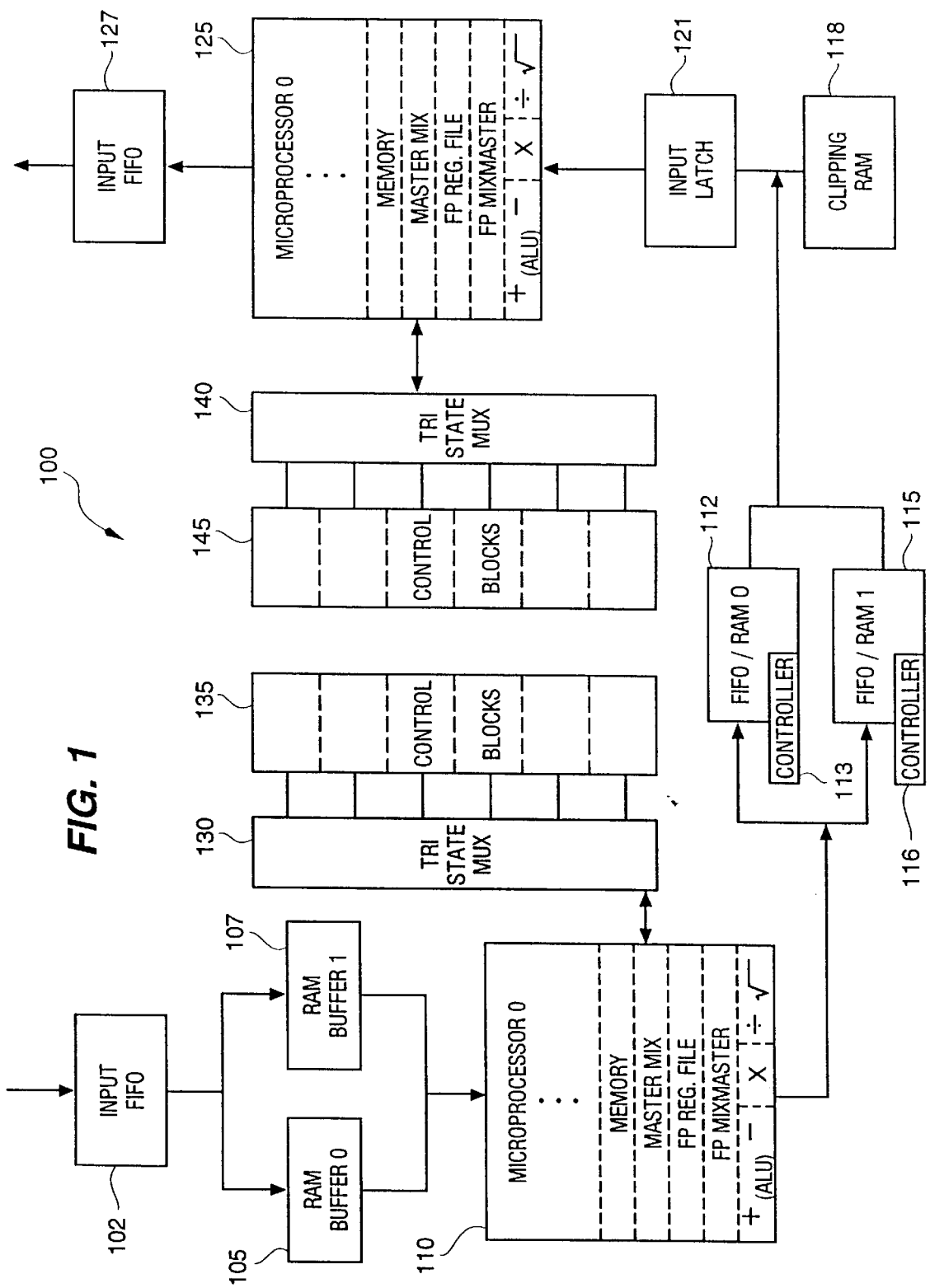
FIG. 1 illustrates a graphics accelerator block diagram containing memory using a hybrid memory scheme.

Application Specific Hardware Architecture—FIGS. 1 and 2

FIG. 1 illustrates a graphics accelerator hardware architecture 100 used in three-dimensional imaging devices. The architecture disclosed in FIG. 1 is an example for illustration only and is not a limitation on the present invention due to any particular hardware architecture or implementation.

Traditional graphics accelerators are floating point intensive architectures implemented in software and/or as general micro-coded processors. The fundamental difference between architecture 100 and traditional graphic accelerator architectures is that architecture 100 contains hard-wired control features, dynamic logic floating point mega-cells, and highly customized fixed data paths. Specifically, the present architecture is designed to perform geometric matrix transformations, polygon decompositions, object lighting/shading, clipping, perspective adjustments, and plane/slope equation calculations on randomly oriented polygons and/or vectors. The typical polygon processed by the present architecture 100 is a three or four sided polygon.

Architecture 100 is not designed to process all three-dimensional primitives. Instead, architecture 100 supports a larger overall three-dimensional processing scheme by quickly and efficiently processing only the most common primitives having the most commonly processed features to facilitate subsequent processing by downstream hardware. Because architecture 100 is implemented in an environment afforded minimal circuit space, an increased demand is created for integrated and/or dual purpose memories utilizing hybrid memory management schemes in an effort to maximize the use of available circuit space. However, it is the dual purpose memory implementation utilizing hybrid memory management schemes that creates a need for the enhanced test system of the present invention.

Architecture 100 is a two-processor vector processing design having a first micro-processor 110 and a second micro-processor 125. Operationally, the first micro-processor 110 pre-processes vertex primitives input by way of a traditional FIFO 102. Dual RAM buffers 105 and 107 provide a staging area from which primitives are accessed by micro-processor 110. Micro-processor 110 performs initial floating point operations on input primitives including, but not limited to, geometric transformations, partial slope calculations, and other preliminary calculations prior to handing the results off to micro-processor 125 by way of memory 112 and 115. Micro-processor 110 includes onboard memory, a master multiplexer for flexible data routing, and other floating point components. Control blocks 135 provide address decoding, transformations, decompositions, and positional assistance direction to micro-processor 110.

Memory devices 112 and 115 are controlled by memory controllers 113 and 116, respectively, which implement a hybrid FIFO/RAM memory scheme and control the enhanced testing system of the present invention. Specifically, memory controllers 113 and 116 include the circuitry to control read/write pointer manipulations to point to memory locations for reading or writing data within memory 112 and 115 respectively in a manner well known in the art. In addition, memory controllers 113 and 116 include the necessary circuitry implementation 780, 880, 980 for the enhanced test system's read/write pointer manipulations for reading or writing test data within memory 112 and 115 respectively, as well as generating test data patterns written to memory 112 and 115, and verifying test data patterns read from memory 112 and 115. Depending on the primitive type and the operations being performed, memory devices 112 and 115 are used in either a modified FIFO or a RAM configuration. The nature of the operations requiring the FIFO or RAM configurations are conceptually illustrated in FIG. 2.

Each column in FIG. 2 illustrates the contents of components in architecture 100. Each row in FIG. 2 illustrates a snapshot of triangle primitives being processed in time. Snapshot 130 illustrates triangle 0 entering input FIFO 102 and continuing directly to RAM buffer 105 while no other primitives are queued for processing. Snapshot 135 illustrates triangle 0 moving from RAM buffer 105 through preprocessing in micro-processor 110 to FIFO/RAM buffer 112, while triangle 1 enters input FIFO 102 and passes to RAM buffer 107. Snapshot 140 illustrates triangle 0 passing from FIFO/RAM 112 through final processing in micro-processors 125 and out the output FIFO 127, while triangle 1 moves from RAM buffer 107 through preprocessing in micro-processor 110 through FIFO/RAM 115, final processing in micro-processor 125, and output FIFO 127. In the meantime triangle 2 enters input FIFO 102 and passes directly to RAM buffer 105 awaiting preprocessing by micro-processor 110.

Snapshot 145 illustrates a "pass-through" primitive PT 0 entering input FIFO 102. A pass-through primitive is one that requires only minimal processing prior to being passed through the graphics accelerator to some downstream hardware. The pass-through primitives are the data that FIFO/RAM memory 112 and 115 store as FIFO data. All other triangle data is stored as RAM data. Snapshot 150 illustrates PT 0 having passed directly through to FIFO/RAM 115 for processing by micro-processor 125 prior to being output through output FIFO 127. In the meantime PT 1 enters input FIFO 102 and triangle 2 passes through preprocessing in micro-processor 110 for staging on FIFO/RAM 112 and subsequent processing by micro-processor 125 once pass-through data is complete.

Snapshot 155 illustrates PT 1 passing from FIFO/RAM 115 through processing by micro-processor 125 and outputting by output FIFO 127. In the meantime PT 2 enters input FIFO 102 and triangle 2 has not proceeded further in processing. At snapshot 160 PT 2 has passed directly through to FIFO/RAM 115 for subsequent processing on micro-processor 125 and output on output FIFO 127, while triangle 3 enters input FIFO 102 and RAM buffer 107, and triangle 2 still awaits subsequent processing by micro-processor 125 once all pass-through data is completed processing. Snapshot 165 illustrates all pass-through data being completed while triangle 2 finally proceeds through final processing in micro-processor 125 and outputting on output FIFO 127. In the meantime triangle 3 passes from RAM buffer 107 through preprocessing in micro-processor 110 for subsequent staging on FIFO/RAM 112, while triangle 4 enters input FIFO 102 and RAM buffer 105. Snapshot 170 illustrates triangle 4 passing from RAM buffer 105 through preprocessing in micro-processor 110 to staging in FIFO/RAM 115 and outputting through outputting FIFO 127, in the meantime triangle 3 is completing preprocessing in micro-processor 110 and moving to staging in FIFO/RAM 112.

Key to the illustration in FIG. 2 is that micro-processors 110 and 125 are simultaneously processing while various primitives and pass-through data are being processed at different rates. Further, by staging multiple pass-through data in a FIFO memory scheme in hybrid memory 115 (and 112 in more complex examples) the pass-through data can be quickly dispatched to the downstream hardware based on the address contained in the data/address field data unit pair for each pass-through data.

Continuing with FIG. 1, primitive output from memory devices 112 and 115 are integrated with light position, intensity, color, and direction output from the clipping RAM staging device 118. The combined data is directed into the input latch queue 121 for processing by micro-processor 125. Micro-processor 125 contains its own individual onboard memory, master multiplexer for flexible data routing, and other floating point components. Control blocks 145 provide lighting assists, clipping, and plane equation direction for micro-processor 125. Completed operations from micro-processor 125 are output on a traditional FIFO queue 127 for subsequent processing beyond the scope of this disclosure.

Generic FIFO and RAM Testing Example—FIGS. 3 and 4

FIG. 3 illustrates a typical FIFO memory 200 that can be tested by writing successively adjacent data fields into memory locations 210–217. The test technique requires only that a write address pointer be incremented to point to successive locations where the data is being written. Verifying the previously written data fields in memory locations 210–217 is accomplished by incrementing a read address pointer to point to each successive memory location 210–217 where the data fields are read and verified individually. As a matter of design choice subject to the particular implementation, a FIFO may be filled completely or to varying desired levels as the implementation requires. In addition, the data read and verification cycle reading from the oldest memory location, typically operates simultaneously with the write cycles or in any other manner as a matter of design choice.

FIG. 4 illustrates a typical RAM memory scheme 250 containing randomly placed data fragments in locations 260–272. Depending on the implementation, data fields may be split among multiple memory locations. For example, data field 2 is distributed between memory locations 263 and 267, while data field 6 is distributed among memory locations 270, 272, and 264. Unfortunately, RAM memory will inevitably become fragmented over time as data is written and read from memory 250. RAM memory 250 illustrates the memory fragmentation resulting in randomly placed data field fragments and unused memory locations 280–282. Fragmentation due to unused memory locations becomes more apparent over time as data is written and subsequently read from memory 250. Therefore, while testing such a RAM device is reduced in its simplest terms to writing data fields and subsequently reading the data fields, ensuring that each memory location contains adjacent full-width data fields is increasingly difficult as memory fragmentation increases.

Enhanced Test System—FIGS. 5–7, and 14

FIG. 5 illustrates an example data field pair 300 and 301 known as a "data unit" 350. In the preferred embodiment a data unit 350 includes a full-width 351 data field 300 and partial-width address field 301 accompanied by an unused address field 302. Note, however, that whether a data unit 350 comprises two or more data fields 300, 301, the focus of the present test system is to occupy all memory locations 300–332 with full-width data fields at least once during testing in order to test for field overflow influences as well as write/read cycle logic errors.

FIG. 5 illustrates FIFO/RAM memory 112 (or 115) with numerous data and address pairs therein. Each data field 300, 310, 320, and 330, is a full-width 351 data field while address fields 301, 311, 321, and 331 are partial-width 352 fields. The problem presented by the unused address field widths 302, 312, 322, and 332, is that each full-width 351 data field 300, 310, 320, 330 has horizontally adjacent data locations, but only partial horizontal adjacency with address fields 301, 311, 321, and 331. To test that each memory location can be accurately written to and read from without error, the simplest embodiment of the present test system is to first write and read the data and address fields as illustrated in first test phase 360 in FIG. 5.

As a second test phase 361, data and address fields are written as illustrated in FIG. 6 where the address and data pairs are in reverse order so that the address field 301 precedes the data field 300 in each data unit 350. That is, the same data fields 300, 310, 320, and 330 are now in the locations previously occupied by address fields in FIG. 5. Similarly, address fields 301, 311, 321, and 331 in FIG. 6, occupy the memory locations previously occupied by data fields in FIG. 5. While the full-width 351 data fields in FIG. 6 now test for horizontal field overflow in a memory location that was previously only partially tested, vertical field overflow between adjacent memory locations once again is only partially tested due to the unused address field widths in memory locations 302, 312, 322, and 332.

Figure 7:
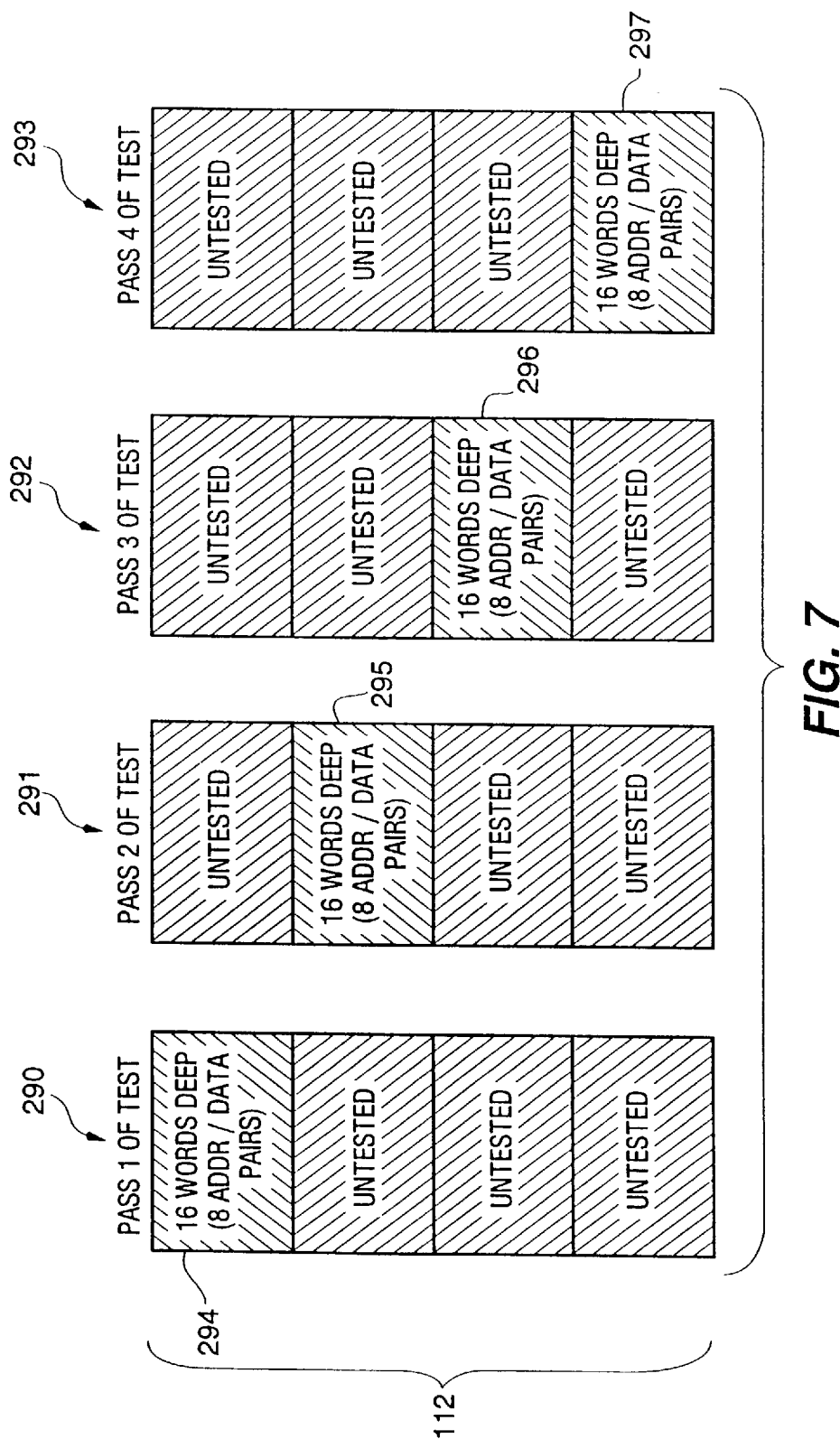

If the overall memory 112 size is large or, as a matter of design choice as in the present implementation where the FIFO scheme requires only a subset of the memory 112 used by the RAM scheme, a hybrid memory 112 can be more efficiently tested by dividing the memory 112 into smaller equally sized memory blocks 294–297 as illustrated in FIG. 7. FIG. 7 illustrates memory 112 subdivided into four equal memory blocks 294–297 so that operationally each memory block can be individually tested with the two phase 360, 361 test design illustrated in FIGS. 5 and 6. The full test sequence requires that the two phase testing be repeated four passes 290–293, each pass shifting the focus of the test from one memory block 294–297 to the next as illustrated in the four test passes 290–293.

The number of memory blocks 294–297 needed to implement the present test technique is dependent on the number of data fields 300, 301 in a data unit 350. That is, in the preferred embodiment, because a data unit comprises a data field and address field pair 300, 301, the depth of the memory 112 and the number of memory blocks 294–297 are an even multiple of two by design. Specifically, the overall memory 112 is 64 words deep while the individual memory blocks 294–297 are 16 words deep so that each memory block can contain 8 data and address pairs. Other memory block sizes and numbers of memory blocks can be accommodated by the present test system as needed.

The smaller memory blocks 294–297 also require a smaller read/write pointer 710 and 720 to address each memory location within each memory block. For example, where the overall memory size is 64 words deep, a 6 bit read/write pointer is required to address all consecutive memory locations in a FIFO memory scheme. Alternatively, by dividing memory 112 into four equal memory blocks 294–297 of 16 words deep each, only a 3 bit read/write pointer is required to address the 8 data and address field pair locations within any one of the 16 word deep memory blocks 294–297. The only additional bits required are to point to each memory blocks themselves. A smaller read/write pointer requires a smaller test circuit and test logic to implement which is one purpose of the present invention.

Figure 14:
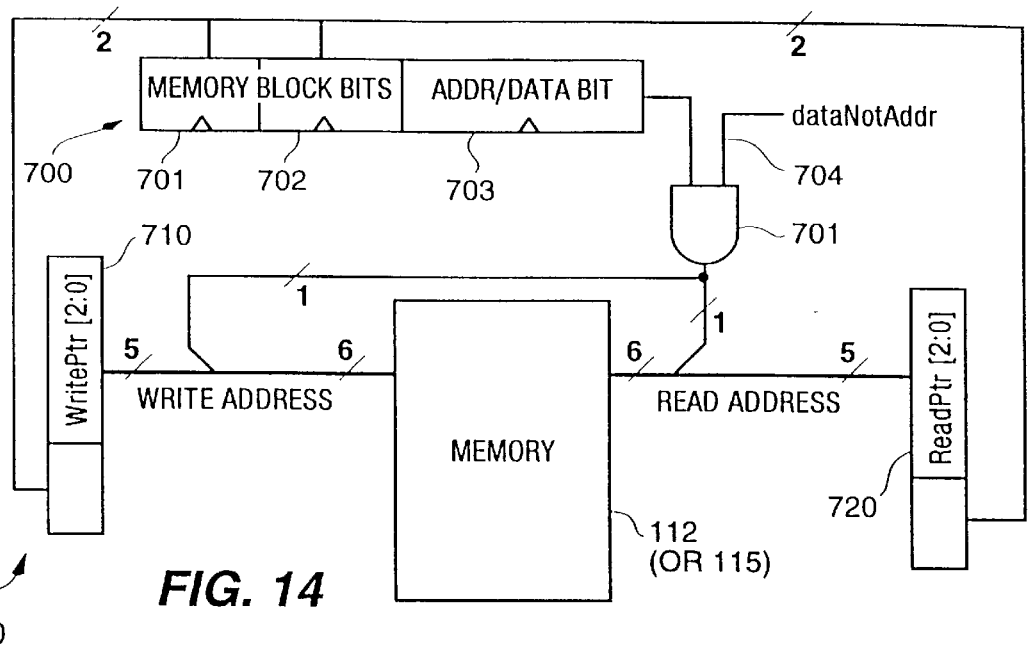
FIGS. 14–16 illustrate circuit diagrams for implementing each test system embodiment.

FIG. 14 illustrates an example of the test circuitry 780 necessary to implement the test embodiment based on the data and address field pair illustrated in FIGS. 5–7. Modifying the test circuit in any of FIGS. 14–16 to accommodate a data unit 350 having more data fields beyond a data field and address field pair is considered within the scope of the present invention.

The test circuit 780 illustrated in FIG. 14 includes a 3 bit programmable register 700 where bits 701 and 702 identify which memory block 294–297 in memory 112 is being tested. Bits 701 and 702 are tied directly to the write address pointer 710 and read address pointer 720. Programmable register bit 703 represents one of two inputs to AND gate 701 and indicates whether the data field or address field is first in the data unit. Toggling programmable register bit 703 causes the data and address fields 300, 301 to swap positions as illustrated between FIGS. 5 and 7.

The second input 704 to AND gate 701 indicates whether an address field 301 or data field 300 is being written or read to memory 112 (or 115). The output of AND gate 701 represents the least significant bit of the write address pointer 710 and read address pointer 720 as needed. Therefore, a six bit address can locate any memory location 300–332 within each of the four available memory blocks 294–297.

Figure 9:
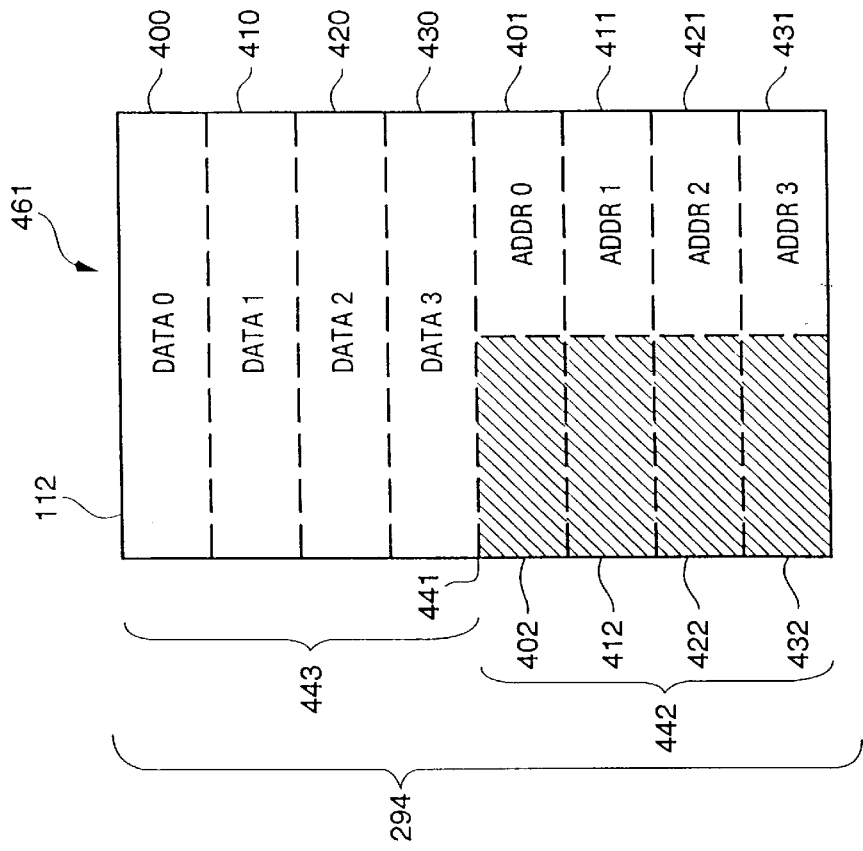
FIGS. 8 and 9 illustrate block diagrams of an alternative test embodiment using segregated address and data fields.
Figure 8:
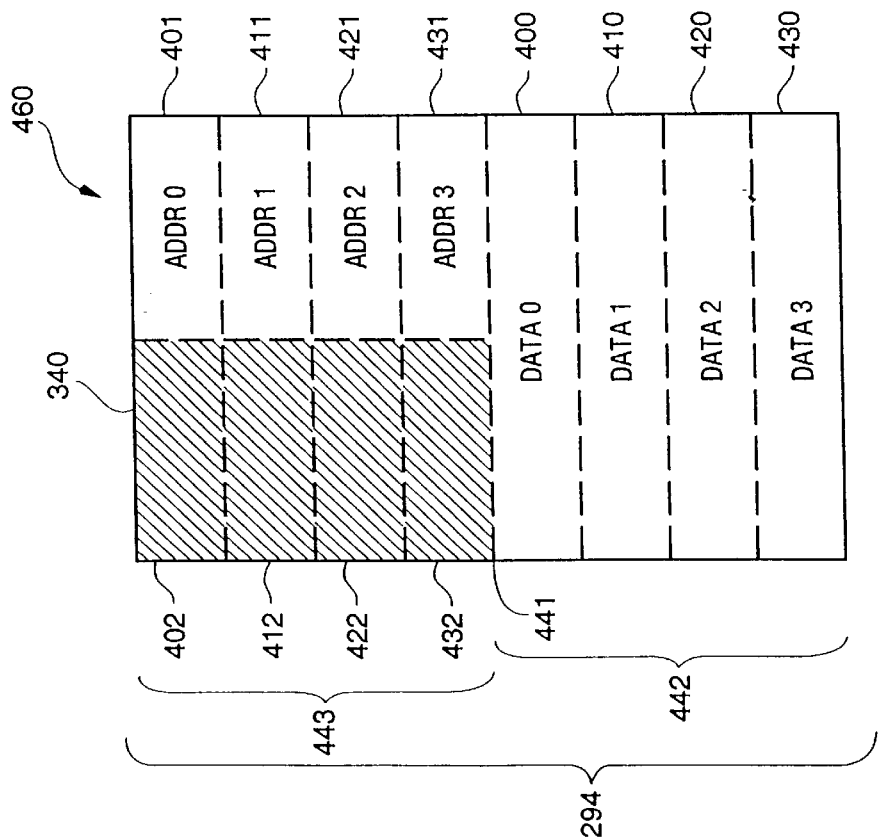
Figure 15:
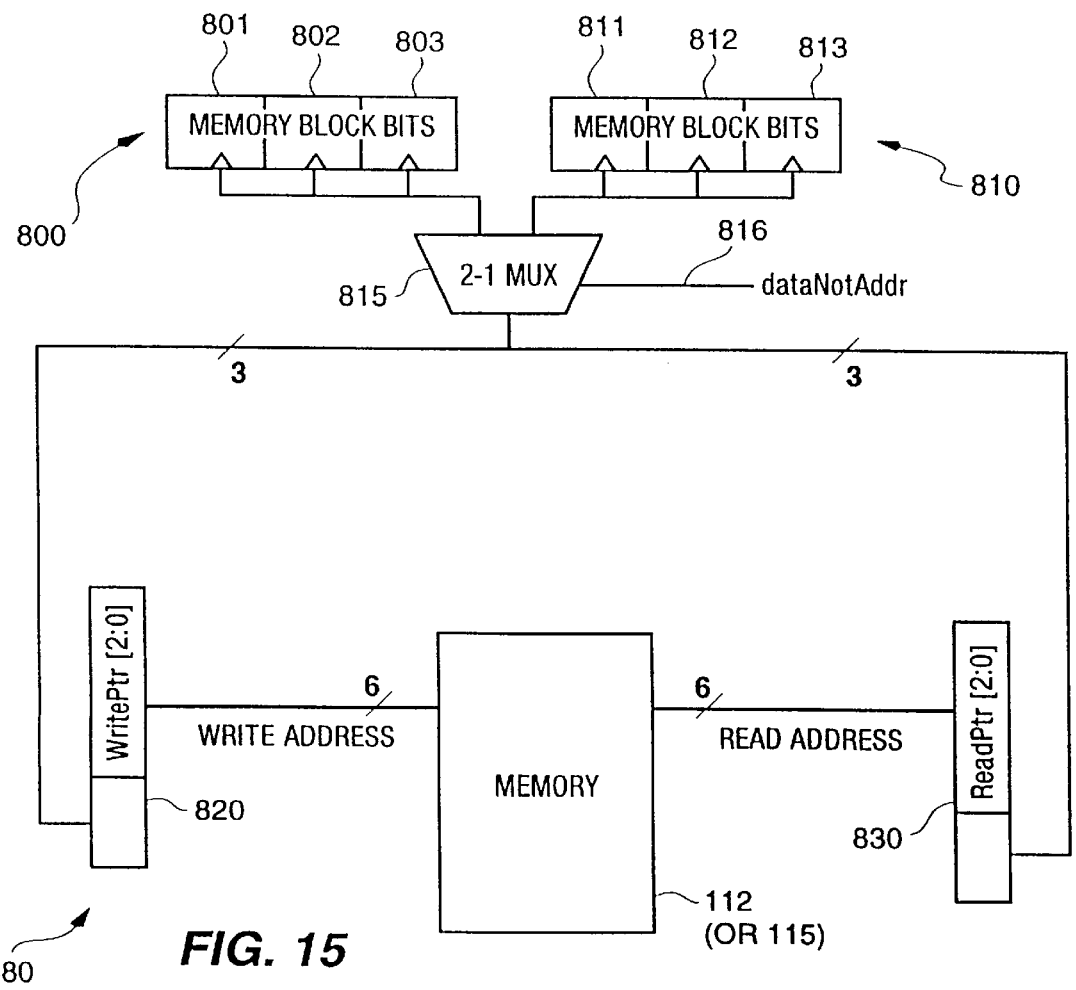

Alternative Test System Embodiment—FIGS. 8–9, and 15

FIGS. 8 and 9 illustrate an alternative technique for the enhanced test system that increases the number of simultaneously horizontally adjacent full-width data fields over the previous embodiment. Memory 112 in FIGS. 8 and 9 represents any one of the four memory blocks 294–297 discussed in FIG. 7. Memory block 294 will be used for discussion purposes.

In first test phase 460 in FIG. 8, memory block 294 in memory 112 contains segregated data/address field pairs where the partial-width address fields 401, 411, 421, and 431, are grouped in upper memory sub-block locations 443 while full-width data fields 400, 410, 420, and 430 are grouped in lower memory sub-block locations 442. This approach organizationally confines unused memory 402, 412, 422, and 432 in upper memory locations 443. The boundary 441 between full-width data 400 and partial address and unused fields 431 and 423 respectively, are the only memory locations where full-width data fields are not adjacent.

In a second test phase 461 illustrated in FIG. 9, memory block 294 in memory 112 contains full-width 351 data fields 400, 410, 420, and 430 in upper memory sub-block locations 443 previously occupied by partial-width address fields, while the partial-width address 401, 411, 421, and 431 accompanied by their unused memory sub-block locations 402, 412, 422, and 432, are grouped in lower memory sub-block locations 442 previously occupied by full-width 351 data fields. Once again, boundary 441 is the only point where a full-width 351 data field is not horizontally adjacent to full-width data fields on both sides. Nevertheless, full-width data field occupancy is achieved in all memory locations with maximum simultaneous horizontal and vertical adjacency per full-width field thereby facilitating a substantially complete field overflow test.

Writing and verifying any full-width 351 data field by way of memory controller 113 or 116 is beneficial for testing for field overflow because the preferred test embodiment can write and verify full-width 351 data in such a way that individual bits are surrounded by bits of an opposite sense. By organizing the bits in each data field 300 in such a way that no one bit is horizontally or vertically adjacent to a bit of a similar orientation, the likelihood of detecting a field overflow anomaly is heightened.

FIG. 15 illustrates the test circuitry 880 needed to implement the test system embodiment previously discussed in FIGS. 8 and 9. The overall circuitry 880 is fundamentally similar to the test circuit 780 illustrated in FIG. 14, however, the FIG. 15 test circuitry 880 includes two programmable registers 800 and 810 providing individual control over the address field 301 and data field 300 locations respectively. Bits 801 and 802 of programmable register 800, and bits 811 and 812 of programmable register 810, indicate which memory block 294–297 in memory 112 is being tested. Bits 803 and 813 indicate whether the address/data fields are located in upper memory sub-block locations 443 or lower memory sub-block locations 442 respectively. Programmable registers 800 and 810 are both controlled by logic in memory controllers such as the FIG. 1 memory controllers 113 or 116.

Multiplexer 815 multiplexes all three bits from either of the programmable registers 800 or 810 based on select bit 816. Select bit 816 is controlled by logic in a memory controller such as the FIG. 1 memory controllers 813 or 816. The three bit output from multiplexer 815 is tied directly to write address pointer 820 and read address pointer 830 respectively. By combining control bits from programmable registers 800 or 810 with respective address bits and write pointer 820 or read pointer 830, any memory location in any memory block 294–297 can be addressed within memory 112 (or 115).

Alternative Test System Embodiment—FIGS. 10–12, and 16

Figure 10:
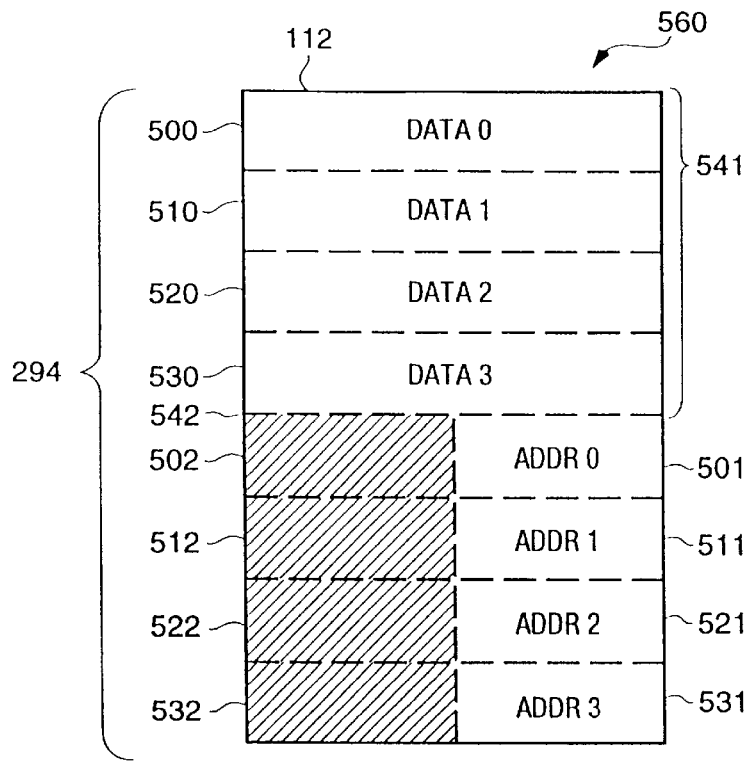
FIGS. 10–12 illustrate block diagrams of an alternative test embodiment using shifted boundary memory blocks.
Figure 11:
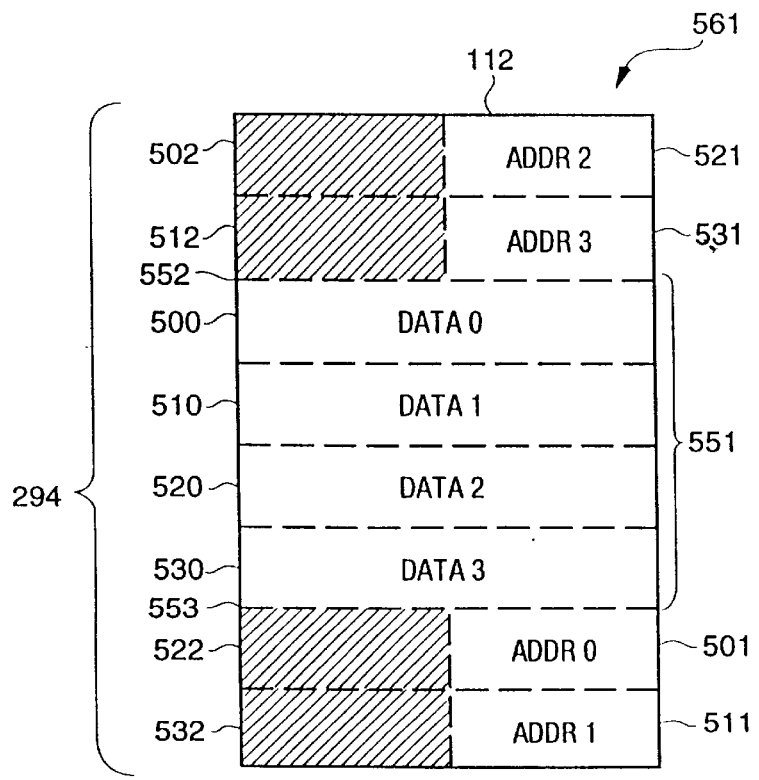
Figure 12:
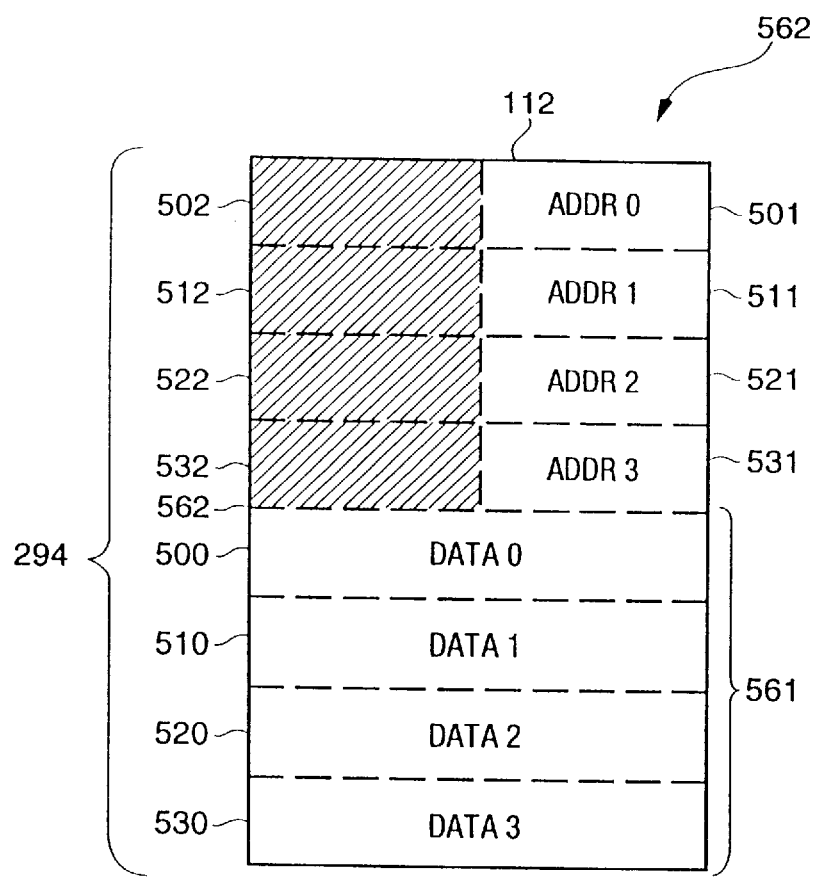

FIGS. 10–12 illustrate an alternative test technique where full-width 351 data field boundaries are overlapped so that each memory location contains a full-width 351 data field surrounded by adjacent full-width data fields at least once during testing. Memory 112 in FIGS. 10–12 represents only one of the four memory blocks 294–297 discussed in FIG. 7.

FIGS. 10–12 illustrate overlapping memory sub-blocks 541, 551, and 561 within memory bock 294 of memory 112. In a first test phase 560 in FIG. 10, memory block 294 contains segregated data fields 500, 510, 520, and 530 within memory sub-block 541, while partial address fields 501, 511, 521, and 531 with their accompanying unused memory portions 502, 512, 522, and 532, are grouped into the remaining memory sub-block locations as available. The only existing block boundary is boundary 542 where full-width data field 530 is adjacent to partial address and unused address fields 501 and 502 respectively.

In a second testing phase 561 illustrated in FIG. 11, data and address pairs are written in segregated form by grouping full-width data fields 500, 510, 520, and 530 into memory sub-block 551 having boundaries 552 and 553 respectively. Partial address fields 501, 511, 521, and 531, and their respective unused memory portion 502, 512, 522, and 532, occupy remaining memory locations as available. Key to the placement of memory sub-block 551 relative to memory sub-block 541, is that read pointer 930 and write sub-pointer 920 are offset, thereby shifting and overlapping the beginning of memory sub-block 551 relative to memory sub-block 541. The result is that full-width 351 data field 510 is horizontally surrounded by adjacent data fields 500 and 520 where boundary 542 previously existed.

FIG. 12 illustrates a third test phase 562 the third memory sub-block 561 which is shifted and overlaps previous memory sub-block 551. Full-width data fields 500, 510, 520, and 530 occupy memory sub-block 561, while partial address fields 501, 511, 521, and 531, with corresponding unused address field portions 502, 512, 522, and 532, occupy the remaining memory locations. Boundary 562 of memory sub-block 561, has previously been surrounded by full-width data as illustrated in FIG. 11. Therefore, the untested boundary condition experienced in FIGS. 8 and 9 is eliminated by the shifted and overlapping full-width data in memory sub-blocks 541, 551, 561 within memory block 294 as illustrated in FIGS. 10–12.

Figure 16:
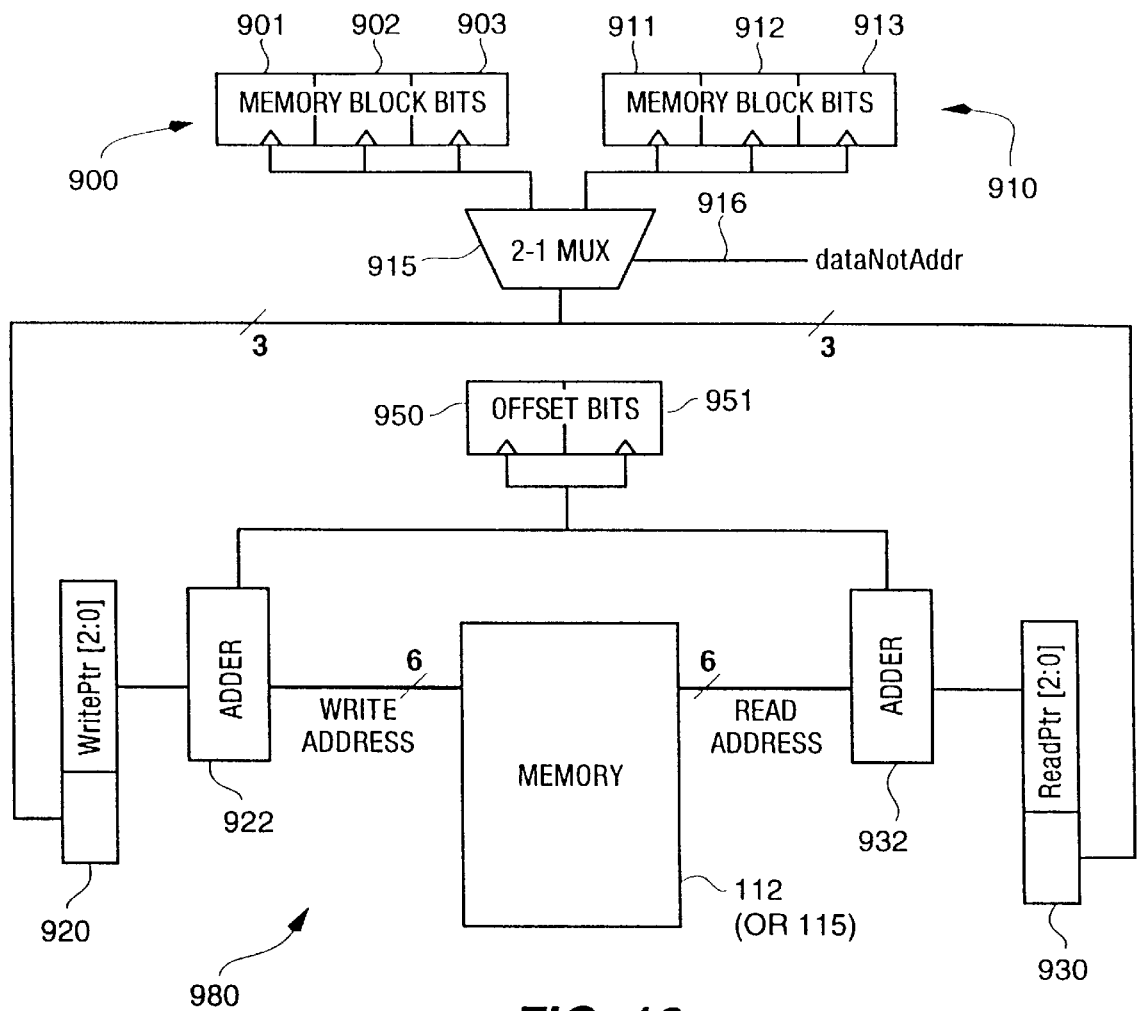

FIG. 16 illustrates the test circuitry 990 needed to implement the test technique previously discussed in FIGS. 10–12. Programmable registers 900 and 910 provide individual control over the address field 301 and data field 300 placement within a memory block 294–297. Bits 901 and 902 of programmable register 900, and bits 911 and 912 of programmable register 910, indicate the memory block 294–297 being tested. Bits 903 and 913 of programmable registers 900 and 910 respectively, indicate the sub-block location within any one memory block 294–297. Additional bits may be required to indicate sub-block locations for more than two sub-blocks per memory block 294–297. Programmable registers 900 and 910 are controlled by logic in memory controllers 113 and 116.

Multiplexer 915 multiplexes all programmable register bits from either programmable register 900 or 910 based on select lead 916 controlled by memory controllers 113 and 116. The 3 bit output from multiplexer 915 is tied directly to write pointer 920 and read pointer 930 respectively.

The 6 bit write address output from write pointer 920 is offset by adder 922 subject to offset control bits 950 and 951. Offset control bits 950 and 951 identify the degree of write address offset 00, 01, 10, 11 required to access memory locations within memory sub-blocks 541, 551, or 561 respectively.

The 6 bit read address output from read pointer 930 is offset by adder 932 subject to offset control bits 950 and 951. Offset control bits 950 and 951 identify the degree of read address offset 00, 01, 10, 11 required to access memory locations within memory sub-blocks 541, 551, or 561 respectively.

Offsetting memory sub-blocks 541, 551, and 561 within each memory block 294–297 for memory 112, fully tests every memory location with full-width data that is surrounded horizontally and vertically by adjacent full-width data fields at least once during the testing. As a matter of design choice memory blocks 294–297 may also be offset for each test phase 560–562 through sub-blocks 541, 551, and 561. As a further alternative to FIG. 16 adders 922 and 932 can be substituted with incrementers so that the respective write address or read address is offset by one rather than a larger offset as can be provided when adders 922 and 923 are used.

Figure 13:
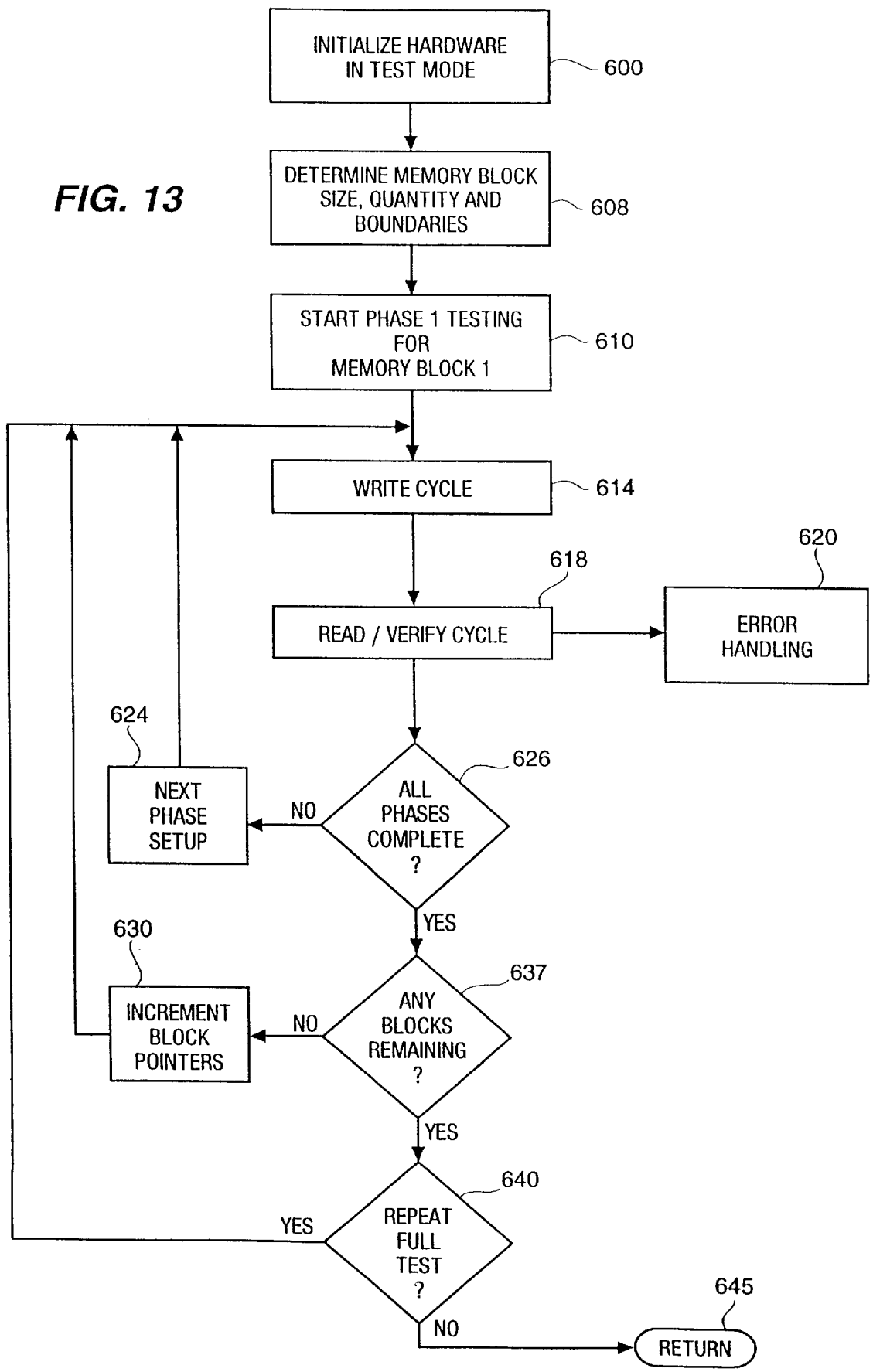
FIG. 13 illustrates an operational flow diagram of the enhanced test system.

Operational Overview—FIG. 13

FIG. 13 illustrates the operational steps for testing a hybrid memory such as the type 112 and 115 discussed in the FIG. 1 architecture 100. Any one of the previously discussed test embodiments may be implemented as a design test, a quality assurance test during or subsequent to manufacturing, or as a product diagnostic for field or other maintenance testing purpose. A test cycle begins by initializing the graphics accelerator and test circuits to the appropriate testing mode at step 600. When the appropriate test sequence is initiated, the memory 112 being tested must be partitioned into the desired size memory blocks 294–297 at step 608 if the partitions are not previously defined by the hardware design.

Testing begins at step 610 with the first test phase 360, 460, or 560 for example, for the first memory block 294–297. The write cycle 614 and read cycle 618 can continue in sequence or in parallel as a matter of design choice. As data is read and verified at step 618, however, any errors or inconsistencies that are identified are handled by a recording, printing, and/or error handling routine 620 as a matter of design choice. If all test phases are not complete at decision block 626, the next test phase 361, 461, 561–562 for example, is set up at 624 and testing continues with the write and read cycles 614 and 618 respectively.

The number of test phases depends on the number of fields within a data unit 350 and the testing scheme within each memory block 294–297. If all test phases are complete for a particular memory block, the test system determines whether any remaining memory blocks are available for testing at decision block 637. If an additional memory block is available for testing, read/write pointers are adjusted accordingly at 630 and processing continues with a phase 1 test by way of write and read cycles 614 and 618 respectively. If no memory blocks remain available for testing at decision block 637, processing continues at decision block 640 where the entire test series can be repeated as desired. If no further testing was desired at decision block 640, control over the memory being tested is relinquished at step 645.

Summary

The enhanced test system for an application specific memory scheme provides an organized test approach for hybrid memory devices that share FIFO and RAM memory schemes. While specific embodiments of this invention are disclosed herein, it is expected that those skilled in the art can and will design alternate embodiments of this invention that fall within the scope of the following claims.

What is claimed is:

1. A method of testing a memory device in which each bit of each memory location is physically adjacent to a corresponding bit of the next contiguous memory location, said method comprising the steps of:

a) partitioning said memory device so that it comprises a first contiguous portion of memory and a second contiguous portion of memory, said first and second contiguous portions of memory contiguous with one another and defining a boundary where they meet;

b) writing a plurality of first test vectors into the memory locations defining said first contiguous portion of memory, one first test vector per memory location, each of said plural first test vectors having a field width equal to the field width of the memory locations within said memory device;

c) writing a plurality of second test vectors into the memory locations defining said second contiguous portion of memory, one second test vector per memory location, each of said plural second test vectors having a field width smaller than the field width of the memory locations within said memory device;

d) after completing steps b) and c) and before completing steps e) and f), verifying that said memory device accurately stored at least one of said plural first and said plural second test vectors;

e) writing said plural first test vectors into the memory locations defining said second contiguous portion of memory, one first test vector per memory location;

f) writing said plural second test vectors into the memory locations defining said first contiguous portion of memory, one second test vector per memory location; and g) after completing steps e) and f), verifying that said memory device accurately stored at least one of said plural first and said plural second test vectors.

2. The method of claim 1, further comprising the steps of:

h) partitioning said memory device so that it comprises a third contiguous portion of memory, a fourth contiguous portion of memory and a fifth contiguous portion of memory, said third, fourth and fifth contiguous portions of memory contiguous with one another, and said boundary lying between two memory locations within said fourth contiguous portion of memory;

i) waiting said plural first test vectors into the memory locations defining said fourth contiguous portion of memory, one first test vector per memory location;

j) writing said plural second test vectors into the memory locations defining said third and fifth contiguous portions of memory, one second test vector per memory location; and k) after completing steps i) and j), verifying that said memory device accurately stored at least one of said plural first and said plural second test vectors.

3. A method of testing a memory device in which each bit of each memory location is physically adjacent to a corresponding bit of the next contiguous memory location, said method comprising the steps of:

a) writing a plurality of first test vectors into even-numbered memory locations within said memory device, one first test vector per memory location, each of said plural first test vectors having a field width equal to the field width of the memory locations within said memory device;

b) writing a plurality of second test vectors into odd-numbered memory locations within said memory device, one second test vector per memory location, each of said plural second test vectors having a field width smaller than the field width of the memory locations within said memory device;

c) after completing steps a) and b) and before completing steps d) and e), verifying that said memory device accurately stored at least one of said plural first and said plural second test vectors;

d) writing said plural first test vectors into odd-numbered memory locations within said memory device, one first test vector per memory location;

e) writing said plural second test vectors into even-numbered memory locations within said memory device, one second test vector per memory location; and f) after completing steps d) and e), verifying that said memory device accurately stored at least one of said plural first and said plural second test vectors.

\* \* \* \* \*